(12) United States Patent
Hasse et al.

(10) Patent No.: US 6,302,056 B1
(45) Date of Patent: Oct. 16, 2001

(54) DEVICE FOR COATING SUBSTRATES WITH A MATERIAL VAPOR IN NEGATIVE PRESSURE OR VACUUM

(75) Inventors: Brunhilde Hasse; Wolfgang Siefert, both of Ettenheim (DE)

(73) Assignee: Rowo Coating Gesellschaft fur beschichtung mbH (DE)

( * ) Notice: Subject to any disclaimer, the term of this patent is extended or adjusted under 35 U.S.C. 154(b) by 0 days.

(21) Appl. No.: 08/849,433

(22) PCT Filed: Nov. 9, 1995

(86) PCT No.: PCT/DE95/01577

§ 371 Date: May 12, 1997

§ 102(e) Date: May 12, 1997

(87) PCT Pub. No.: WO96/15544

PCT Pub. Date: May 23, 1996

(30) Foreign Application Priority Data

Nov. 12, 1994 (DE) .................................................. 44 40 521

(51) Int. Cl.[7] .................................................. C23C 16/00
(52) U.S. Cl. ................. 118/723 R; 118/715; 118/723 VE
(58) Field of Search .......................... 118/723 R, 723 VE, 118/715

(56) References Cited

U.S. PATENT DOCUMENTS

| | | |
|---|---|---|
| 3,482,133 | 12/1969 | Dugdale et al. . |
| 4,336,277 | 6/1982 | Bunshah et al. . |
| 4,692,230 | 9/1987 | Nibei et al. . |
| 4,762,756 | 8/1988 | Bergmann et al. . |
| 5,104,509 | 4/1992 | Buck et al. . |
| 5,112,466 | * 5/1992 | Ohta et al. ...................... 204/298.05 |
| 5,221,349 | * 6/1993 | Tamagaki ............................. 118/708 |
| 5,587,207 | * 12/1996 | Gorokhovsky ...................... 427/571 |

FOREIGN PATENT DOCUMENTS

| | | |
|---|---|---|
| 683776 | 5/1994 | (CH) . |
| 145283 | 12/1980 | (DE) . |
| 4200429 | 7/1993 | (DE) . |
| 4217450 | 8/1993 | (DE) . |
| 4425221 | 8/1995 | (DE) . |
| 9409176 | 10/1992 | (EP) . |
| 0545863 | 6/1993 | (EP) . |
| 9516798 | 12/1993 | (EP) . |
| 1447754 | * 9/1976 | (GB) . |
| 4-346655 | 12/1992 | (JP) . |
| 5-117843 | 5/1993 | (JP) . |
| 6-69267 | 9/1994 | (JP) . |
| 7-90557 | 4/1995 | (JP) . |
| 7-151901 | 6/1995 | (JP) . |
| 7-188909 | 7/1995 | (JP) . |
| 9314240 | 7/1993 | (WO) . |
| WO/94/09176 | * 4/1994 | (WO) . |

* cited by examiner

Primary Examiner—Deborah Jones
Assistant Examiner—Lymarie Miranda
(74) Attorney, Agent, or Firm—Gudrun E. Huckett

(57) ABSTRACT

An apparatus for coating a substrate with a material vapor in negative pressure includes a material vapor source for releasing a material vapor and an ionization device having a cold cathode and a cold anode for producing an arc discharge between anode and cathode for ionizing the material vapor to form a plasma. A first power supply is provided for the ionization device and a second power supply is provided for the material vapor source.

21 Claims, 1 Drawing Sheet

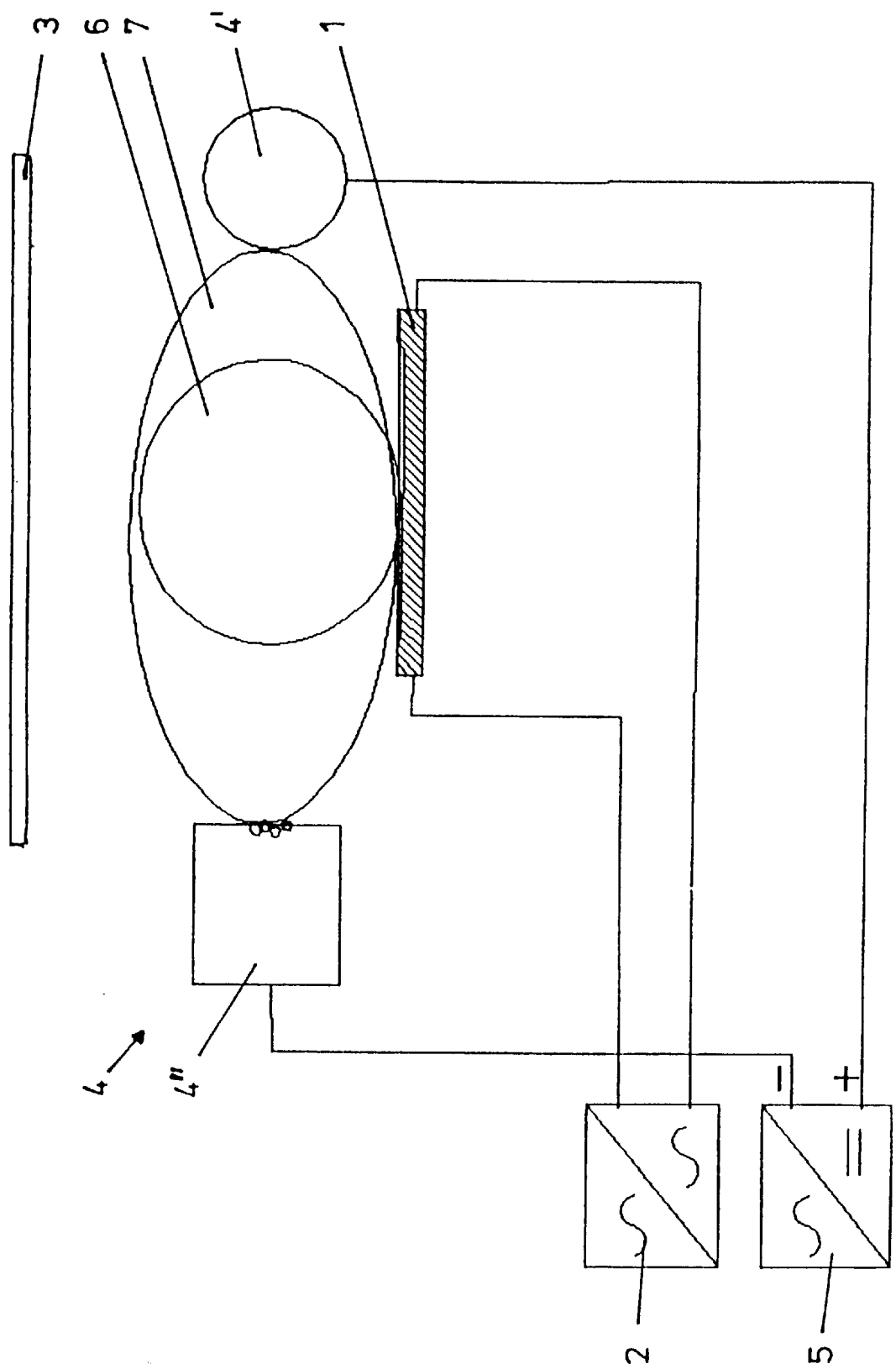

DEVICE FOR COATING SUBSTRATES WITH A MATERIAL VAPOR IN NEGATIVE PRESSURE OR VACUUM

This is a national stage application pursuant to 35 U.S.C. 371 of Application No. PCT/DE95/01577, filed Nov. 9, 1995.

BACKGROUND OF THE INVENTION

The invention relates to a device for coating substrates with a material vapor in negative pressure or vacuum.

The field of the invention is thus coating of substrates, for example, foils, plates or shaped parts. There are various methods to coat such substrates. On the one hand, there is the possibility to vaporize neutral particles thermally which will then deposit on the material to be coated. As a further possibility there is sputtering. Also, there is a method of depositing ionized particles onto the surface to be coated whereby for this purpose an electrical field between an anode and a cathode is produced in which the ionization of particles occurs in a plasma. It is, in general, known that for generating thin layers in vacuum an ionization of the material vapor results in improved coating properties. Especially the adhesion and the compactness of the layers can be improved considerably. Furthermore, there is the possibility of a reactive deposition. The ionization of the material vapors can be achieved by electrical discharge, whereby a differentiation must me made between glow discharge and electric arc discharge. The invention is based on the latter method.

From German Offenlegungsschrift 42 00 429 a coating device is known in which thermally produced material vapors are ionized by anodically determined vacuum electric arc. The basic principle is that the vaporizing device is used for producing the material vapor and also as an anode wherein the crucible in which the material vapor is produced is switched as the anode. This known device has the advantage that for maintaining the electric arc no process gas is required, however, the known coating device has a considerable number of disadvantages. For example, it is disadvantageous that the electric circuit of the thermal vaporizer is coupled to the electric circuit of the electric arc so that they affect one another in a detrimental manner. For example, in a crucible through which current flows high magnetic fields are generated such that the current flow between the crucible (anode) and the cathode is made so difficult that ionization and thus anode activity no longer takes place or only to a very limited extent. The arc is thus very instable. A further disadvantage is the parallel switching of the ohmic resistance of the crucible with the plasma resistance across the crucible. When the plasma resistance is of the same magnitude as the crucible resistance, the effective ohmic crucible resistance is reduced. Thus, the ionization and the vaporization rate are coupled tightly with one another which greatly limits the optimization of the coating via ionization and vaporization rate. A further disadvantage is finally the spatial fixation of ionization onto the crucible area because the crucible functions simultaneously as the anode.

From German Offenlegungsschrift 42 17 450 an ion plating method as well as a corresponding ion plating device with a material vapor source in a hood-like ionization chamber and with an electrically separately supplied electron gun, the beam of which enters the hood via a lateral opening and vaporizes the material contained within the container. This device is used for ionic vapor deposition on metal bands.

In East German patent 145 283 a method for generating wear-resistant and corrosion-resistant layers on metallic workpieces by ion treatment in vacuum is disclosed. The device comprises a material vaporizer as well as, in a perpendicular arrangement thereto, an ionization source. Furthermore, a supply device for reactive gases is provided. The power sources for the vaporizer and the ionization source are electrically separate from one another. The device is used for reactive ion vapor deposition of wear-resistant hard material coatings.

From Swiss patent 683 776 a device for continuous ion vapor deposition on packaging foil strips is disclosed. The device is comprised of a material vaporizer with correlated electron gun as well as an ionization device employing a hollow cathode low voltage electron gun, the beam of which is guided perpendicularly to the vapor stream. The power supply is also provided by separate electric sources.

U.S. Pat. 4,336,277 discloses a device with an ionization device comprised of an anode and a glow cathode for producing an ionized electron beam as well as a material vapor source. An electric separation with separate current supplies is provided for the vaporizer and the ionization device. The device is used for reactive ion vapor deposition.

In U.S. Pat. 4,692,230 a device for sputtering stacked layers is disclosed. It also includes an electrical separation of the material vapor source in the form of a magnetron sputtering cathode and of the ionization device comprised of a glow cathode and anode.

In U.S. Pat. 3,482,133 a source for generating ions or electrons is disclosed whereby with the aid of the ion or electron beam a ceramic material is vaporized. The charge support source comprises a cathode in the form of a thin metal plate as well as a metal net arranged in front thereof and acting as the anode.

It is an object of the invention to provide a coating device in which a mutual disturbing effect of the supply current circuits is prevented and the parameters deposition rate and ionization degree can be adjusted independent of one another while maintaining a stable arc discharge between the anode and the cathode.

SUMMARY OF THE INVENTION

As a technical solution the invention suggests an apparatus for coating substrates with a material vapor in negative pressure or vacuum comprising a material vapor source as well as an ionization device with a cold anode and a cold cathode for ionizing the material vapor in an arc discharge between anode and cathode that produces a plasma and is supported by the material vapor, whereby the material vapor source and the ionization device with its anode and cathode are electrically separate from one another.

The inventive apparatus for coating a substrate with a material vapor in negative pressure is primarily characterized by:

a material vapor source for releasing a material vapor;
an ionization device comprised of a cold cathode and a cold anode for producing an arc discharge between the anode and the cathode for ionizing the material vapor to form a plasma;
a first power supply for the ionization device;
a second power supply for the material vapor source.
The anode is preferably temperature-controlled.
The cathode is preferably temperature-controlled.
The cathode and anode are temperature-controlled.
The anode consists of an electrically conducting, difficult-to-melt, high temperature-resistant material.

A magnetic field is preferably supplied in the vicinity of the anode.

The first and second power supplies are expediently pulsed.

The apparatus may include a device for increasing cathode stability by homogenizing cathode consumption.

The device may include a device for igniting the arc discharge.

The device may include a device for accelerating ions.

The ionization device is arranged between the material vapor source and a substrate to be coated.

The distance between the ionization device and a substrate to be coated is adjustable.

The distance between the ionization device and the material vapor source is adjustable.

The distance between the material vapor source and a substrate to be coated is adjustable.

The distance between the ionization device and a substrate to be coated is adjustable and the distance between the ionization source and the material vapor source is adjustable.

The material vapor source is selected from the group consisting of a thermal vaporizing generator including material containers heated by inductive heating, resistance heating or electron beam heating; a sputtering device; an anodic electric arc vaporizing device; a cathodic electric arc vaporizing device; and a material vapor supplying device for supplying a gas or a gas mixture.

The apparatus may include a device for supplying a reactive gas or a reactive gas mixture to an ionization zone of the ionization device.

The device for supplying is the anode. The anode is a tube and has openings.

The invention also relates to a substrate coated by the inventive apparatus.

With the circuit-technological separation of the material vapor source from the ionization device with complete electrical decoupling there is no longer a mutually disturbing influence. Furthermore, the deposition rate and the ionization degree are decoupled from one another and can thus be adjusted and optimized over a wide range whereby the parameters can be selected individually according to the specifications because both parameters "ionization degree" and "vaporization rate" are separate from one another. A "cold" anode in this context refers to an inactive current-supply electrode which is not consumed. The "cold" anode has a temperature below the softening point of the anode material at which during operation of the electric arc discharge melting and/or vaporization processes will not occur. The "cold" anode, with respect to this definition, may thus be actually hot in the conventional sense. In the end, the cold temperature of the anode depends on the respective anode material. It is important that no melting and vaporization processes occur at the anode. However, the temperature of the "cold" anode is preferably so high that condensation processes at the anode surface are suppressed as much as possible in order to maintain the electric conductivity of the anode. These condensation processes are especially important for reactive processes in which the produced material vapor chemically reacts with an additionally supplied reactive gas or reactive gas mixture. A "cold" cathode is to be understood as an electrode which is consumed under formation of cathode spots. The electron emission in contrast to a "hot" cathode occurs at microscopically small, extremely hot spots.

A further embodiment suggest that the anode and/or the cathode for reaching the respectively desired cold state can be cooled or heated. By being able to influence the temperature of the cold anode and/or cathode by cooling or heating, the optimal operational temperature under consideration of the aforementioned criteria can be selected. Of course, it is also possible to use a non-active anode, which is not cooled or heated, as long as the criterium of inactivity especially with respect to the aforementioned criteria is fulfilled.

A further embodiment suggests that the anode is comprised of an electrically conducting, difficult-to-melt and high temperature-resistant material. These can be metals or metal alloys (for example, tungsten or molybdenum). As anode material it is also possible to use graphite or mixed ceramics whereby in the case of the latter mixed ceramics an electrically conducting material, especially metals, are contained within the ceramic material. Of course, other materials are also suitable and the invention is not limited to the mentioned materials.

A further embodiment of the inventive coating apparatus suggests that in the area of the anode an additional magnetic field is supplied. Supplying an additional magnetic field serves to homogenize the anodic projection and thus also to suppress anode activity. Magnetic fields occur especially when the vaporization process is produced by high currents or current densities, for example, by resistance heating. With the additionally supplied magnetic field, these magnetic fields in the vicinity of the anode are to be compensated which otherwise would result in current concentrations in the vicinity of the anode. The goal of the magnet field superimposition is thus a homogenous distribution.

A further preferred embodiment suggests that the voltage supply for anode and cathode is pulsed. By switching on and off periodically for short periods of time the current supply between anode and cathode, respectively, the melting process at the anode can be prevented or at least delayed so that the anode service life is correspondingly prolonged. The arc discharge will collapse during the off-phase but the frequency and the length of the on and the off phase is to be selected such that a uniform substrate coating with the material vapor is still possible.

A further embodiment suggests that an additional device for increasing the cathode stability by homogenization of the cathode consumption is to be provided. The increase of the cathode stability is necessary when the cathode material is different from the vaporized material. The additional device can be a magnet field (permanent magnet or solenoid), a covering of a portion of the cathode surface (results furthermore in reduced consumption), and/or a suitable arrangement of the cathode surface so that it is not directly subjected to the material vapor.

A further embodiment suggests that an additional ignition device for igniting the arc discharge is provided. The ignition can be performed by a so-called sliding discharge, by a small thermal vaporizer between cathode and an auxiliary anode, or by a bimetal contact. The power supply may have an idle voltage below 100 volt whereby a separate ignition pulse has a few hundred volt. Of course, it is also possible to provide a power supply with an idle voltage of a few 100 volt.

In a further embodiment it is suggested that an additional device for accelerating the ions is provided. A dc or pulsed (unipolar or bipolar) voltage supply can be supplied between the anode and the substrate or between the anode and the crucible or between the substrate and an auxiliary electrode. With such a bias voltage the coating of the substrate is improved.

Advantageously, in another embodiment of the inventive coating apparatus, the ionization device is arranged between the material vapor source and the substrate to be coated. The advantage is that symmetrical conditions can be provided in which the substrate surface is positioned opposite the plasma, while the material vapor source is arranged on the other side of the plasma and can uniformly release the vaporized particles into the plasma.

A further preferred embodiment suggests that the distance between the location of the ionization device and/or the location of the substrate to be coated and/or the location of the material vapor source can be changed. By spatially separating the electrodes from the material vapor source, there is the possibility to vary the location of ionization relative to the distance to the substrate, so that a further parameter for optimizing is provided. Of the three elements, i.e., the ionization device, the material source, and the substrate, any two element pairs can be varied in their spatial relation to one another. Of course, it is also possible to arrange all three elements so as to be variable in their location.

A further embodiment of the inventive coating apparatus suggests that the material vapor source is a material vapor generator using thermal vaporization by resistance-heated, inductively heated, or electron beam-heated crucibles, sputter technique, anodic or cathodic electric arc vaporization or a material vapor supply with a corresponding gas or gas mixture. The material vapor generators of the aforementioned kind are known technologies. As a material vapor source it is also possible to use a CVD (chemical vapor deposition) method whereby, instead of the vapor generator, a supply for the corresponding reactive gas component is provided. Thus, the material vapor is supplied as a gas or gas mixture from gas generators or gas containers to the inventive coating apparatus.

A further preferred embodiment of the inventive coating apparatus suggests that an additional reactive gas or reactive gas mixture is supplied to the ionization zone via a corresponding supply. This allows the possibility for reactive deposition, i.e., the inventive coating method can also be used for reactive deposition, when via a suitable reactive gas supply the reactive gas or the reactive gas mixture is guided into the ionization zone. Especially, the reactive gas and the reactive gas mixture are supplied into the area of the arc discharge. A further embodiment suggests that the anode is embodied as a supply for the reactive gas or reactive gas mixture. For this purpose, as a supply for the reactive gas or reactive gas mixture, the anode can be in tubular shape with openings. An especially advantageous embodiment of the invention is thus provided in that the anode is embodied in tubular form as a supply for a reactive gas. With defined openings along the tube, the reactive gas can directly be supplied into the discharge of the electric arc where it is activated in a directed manner. When, for example, the vapor generator vaporizes aluminum and supplies via the anode tube oxygen, aluminum oxide coatings can be generated at high deposition rates.

BRIEF DESCRIPTION OF THE DRAWING

One embodiment of an inventive apparatus for coating substrates with a material vapor in negative pressure or vacuum will be described with the aid of the drawing which in a purely schematic manner shows the inventive coating apparatus in order to explain the basic principle.

DESCRIPTION OF PREFERRED EMBODIMENTS

The coating device comprises firstly a material vapor source 1 which in the shown embodiment is a thermal vaporizer which is connected to the corresponding power supply 2. Instead of the thermal vaporizer, it is also possible to supply the material vapor as a gas or gas mixture from a gas generator or from gas containers.

Opposite the material vapor source 1, a substrate 3 to be coated is provided which is purely schematically represented in the drawing. Between the material vapor source 1 and the substrate 3 an ionization device 4 with cold anode 4' and cold cathode 4" is provided which are connected to a respective power supply 5. The anode 4' has a suitable geometry in the form of a so-called extended anode so that no current concentrations will occur at the anode. The coating apparatus functions as follows:

By activating the material vapor source 1 with the current supply 2, schematically indicated material vapor 6 is generated. After this activation of the material vapor source 1, a voltage, for example, 60 volt between anode 4' and cathode 4" is supplied via the current supply 5. At the surface of the cathode 4" so-called cathode spots occur which are schematically indicated in the drawing and which generate an arc discharge between the anode 4' and the cathode 4". Along the path from the cathode 4" to the anode 4' the emitted electrons ionize, via unelastic impact, the material vapor 6 under formation of a plasma 7. The degree of ionization can be varied with the arc current. With the electric and spatial separation of the material vapor source 1 and the ionization device 4 no mutual disturbing influences are present. Furthermore, the deposition rate and the ionization degree are decoupled from one another and can thus be adjusted and optimized over a wide range independent from one another. With the spatial separation of the electrode from the material vapor source 1, there is the possibility to vary the location of ionization relative to the distance to the substrate 3, thus providing a further parameter for optimizing.

Not represented in the drawing is the possibility of a reactive deposition by supplying with a suitable reactive gas supply a corresponding reactive gas or reactive gas mixture into the ionization zone. For example, the anode 4' can be in tubular form and can be used as a supply for the reactive gas. With defined openings along the tube the reactive gas can be directly introduced into the discharge of the electric arc when it can be activated in a directed manner. When, for example, aluminum is vaporized in the material vapor source 1 and, via the anode tube, oxygen is supplied, aluminum oxide layers with a high deposition rate can be produced on the substrate 3.

In a non-represented embodiment a plurality of sources can be arranged adjacent to one another in order to thus allow coating in a band deposition apparatus.

The present invention is, of course, in no way restricted to the specific disclosure of the specification and drawings, but also encompasses any modifications within the scope of the appended claims.

What is claimed is:

1. An apparatus for coating a substrate with a material vapor in negative pressure, said device comprising:
   a material vapor source for releasing a material vapor;
   an ionization device comprised of a cold cathode and a cold anode for producing an arc discharge between said anode and said cathode for ionizing the material vapor to form a plasma;
   a first power supply for said ionization device;
   a second power supply for said material vapor source;
   wherein said cold cathode is configured to emit electrons for said arc discharge at microscopically small, extremely hot cathode spots with consumption of said cold cathode.

2. An apparatus according to claim 1, wherein said anode is heatable or coolable.

3. An apparatus according to claim 1, wherein said cathode is heatable or coolable.

4. An apparatus according to claim 1, wherein said anode and said cathode are heatable or coolable.

5. An apparatus according to claim 1, wherein said anode consists of an electrically conducting anode material, said anode material having an anode temperature below a softening point of said anode material such that said anode is not consumed during arc discharge.

6. An apparatus according to claim 1, wherein a magnetic field is supplied in the vicinity of said anode.

7. An apparatus according to claim 1, wherein said first and second power supplies are pulsed.

8. An apparatus according to claim 1, including a device for increasing cathode stability by homogenizing cathode consumption.

9. An apparatus according to claim 1, including a device for igniting the arc discharge.

10. An apparatus according to claim 1, including a device for accelerating ions.

11. An apparatus according to claim 1, wherein said ionization device is arranged between said material vapor source and a substrate to be coated.

12. An apparatus according to claim 1, wherein a distance between said ionization device and a substrate to be coated is adjustable.

13. An apparatus according to claim 1, wherein a distance between said ionization device and said material vapor source is adjustable.

14. An apparatus according to claim 1, wherein a distance between said material vapor source and a substrate to be coated is adjustable.

15. An apparatus according to claim 1, wherein a distance between said ionization device and a substrate to be coated is adjustable and wherein a distance between said ionization source and said material vapor source is adjustable.

16. An apparatus according to claim 1, wherein said material vapor source is selected from the group consisting of a thermal vaporizing generator; a sputtering device; an anodic electric arc vaporizing device; a cathodic electric arc vaporizing device; and a material vapor supplying device for supplying a gas or a gas mixture.

17. An apparatus according to claim 1, including a device for supplying a reactive gas or a reactive gas mixture to an ionization zone of said ionization device.

18. An apparatus according to claim 17, wherein said device for supplying is said anode.

19. An apparatus according to claim 18, wherein said anode is a tube and has openings.

20. A substrate coated by said apparatus of claim 1.

21. An apparatus according to claim 16, wherein said thermal vaporizing generator has material containers heated by inductive heating, resistance heating or electron beam heating.

\* \* \* \* \*

UNITED STATES PATENT AND TRADEMARK OFFICE
CERTIFICATE OF CORRECTION

PATENT NO. : 6,302,056 B1
DATED : October 16, 2001
INVENTOR(S) : Brunhilde Hasse, and Wolfgang Siefert It is certified that error appears in the above-identified patent and that said Letters Patent is hereby corrected as shown below:

Title page,
Item [73] Assignee, "fur beschichtung" should read -- für Beschichtung --.
Item [73] Assignee, the following assignee name is added: -- APVV Angewandte Plasma-, Vakuum- und Verfahrenstechnik GmbH (DE) --.

Signed and Sealed this

Twelfth Day of March, 2002

Attest:

JAMES E. ROGAN
Attesting Officer
Director of the United States Patent and Trademark Office